United States Patent
Shirai et al.

(10) Patent No.: US 6,826,212 B2
(45) Date of Patent: Nov. 30, 2004

(54) MODULE FOR OPTICAL COMMUNICATIONS

(75) Inventors: Masataka Shirai, Higashimurayama (JP); Junichiro Shimizu, Hino (JP); Shinji Tsuji, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/942,718

(22) Filed: Aug. 31, 2001

(65) Prior Publication Data

US 2002/0118713 A1 Aug. 29, 2002

(30) Foreign Application Priority Data

Feb. 27, 2001 (JP) ........................................ 2001-052302

(51) Int. Cl.[7] ................................................ H01S 3/04
(52) U.S. Cl. ............................ 372/36; 372/34; 372/35; 372/43; 372/44; 372/45; 372/46; 372/47; 372/48; 372/49; 372/50
(58) Field of Search .......................... 372/34–36, 43–50

(56) References Cited

U.S. PATENT DOCUMENTS 4,962,057 A * 10/1990 Epler et al. ................. 117/103
5,479,544 A * 12/1995 Ono et al. ................... 359/180
5,642,371 A * 6/1997 Tohyama et al. ............. 372/20
6,377,597 B1 * 4/2002 Okumura ..................... 372/46

FOREIGN PATENT DOCUMENTS

JP 04-072783 3/1992

OTHER PUBLICATIONS

K. Kudo et al, "1.55 um Wavelength–Selectable Microarray DFB–LD's with Monolithically Integrated MMI Combiner, SOA, and EA–Modulator," IEEE Photonics Technology Letters, vol. 12, No. 3, p. 242.

* cited by examiner

Primary Examiner—Don Wong
Assistant Examiner—Delma R. Flores Ruiz
(74) Attorney, Agent, or Firm—Mattingly, Stanger & Malur, P.C.

(57) ABSTRACT

A module for optical communication intended for decreasing the consumption power of a modulator integrated laser, in which a, multiple-quantum well constituting a laser active layer region comprises InGaAlAs/InGaNAs to keep the reliability and optical power level even when a chip is kept at a high temperature, and the difference of wavelength between the oscillation wavelength and the band gap wavelength of the modulator and the laser should be made greater in proportion with the elevation of the chip setting temperature for maintaining the transmission performance, by which the temperature difference between the module case temperature and the chip setting temperature is reduced to decrease the module consumption power.

15 Claims, 7 Drawing Sheets

ΔT[°C] (difference between case-temperature and chip-temperature)

112 : InGaAlAs quantum well
113 : InGaAlAs barrier layer
114 : electron
115 : hole 200 : optical output of InGaAlAs MQW laser
201 : optical output of InGaAsP MQW laser

MODULE FOR OPTICAL COMMUNICATIONS

BACKGROUND OF THE INVENTION

This invention relates to a module for optical communication having a semiconductor laser chip region and a modulator. The module for optical communication according to this invention is extremely useful when applied, for example, to an optical transmission module including a temperature controlled electroabsorption type optical modulator integrated laser. It converts electric signals into optical signals in the optical fiber communication.

In a modulator integrated semiconductor laser for use in optical communication (hereinafter referred to as a modulator integrated laser), it has been necessary to keep the chip temperature of the modulator integrated laser constant in order to stably keep the oscillation wavelength of the laser, optical output power, the form of the extinction curve and the chirping characteristics of the modulator in the semiconductor laser for long time even upon change of the environmental temperature or the like.

For instance, in an existent modulator integrated laser, a laser active layer and a modulator absorption layer are constituted with a multiple-quantum well (MQW) comprising InGaAsP (indium-gallium-arsenic-phosphorus) for the laser active layer. Accordingly, in view of the feature of the band structure, it results in a problem of lowering the optical power at high temperature and, at the same time, a problem in view of long time stability of the wavelength. Therefore, optical signals have been transmitted while setting the temperature of the semiconductor laser chip constant at a temperature of 30° C. or at a temperature sufficiently lower than that.

Further, with an aim of efficient operation of optical networks and transmission modules, an optical modulator integrated laser having a wavelength variable function has been known recently. For example, this is described in a document (1): Japanese Patent Published Unexamined Patent Application No. Hei 4-72783 or in the recent document (2); IEEE Photonics Technology Letters, Volume 12, No. 3, p. 242. The wavelength variable function has been attained therein by controlling the temperature of the laser region. In the chip having the wavelength variable function, it is necessary that characteristics other than the oscillation wavelength of the laser, that is, the optical output power and the modulator performance can be kept stably for a long period of time also in a case where the temperature of the laser region is changed within a predetermined range, that is, a temperature range corresponding to the range in which the wavelength of the laser is intended to be changed.

SUMMARY OF THE INVENTION

Subjects will be described below for two cases of a modulator integrated laser having no wavelength variable function (hereinafter referred as a single channel modulator integrated laser) and a modulator integrated laser having a desired wavelength variable function (hereinafter referred to as a wavelength variable modulator integrated laser).

At first, an optical transmission module including a single channel modulator integrated laser is to be described. FIG. 12 is an example of a constitution for an optical transmitter 75 including a modulator integrated laser. The optical transmitter 75 has mounted therein an optical transmission module 74 (hereinafter referred to as a module) including a modulator integrated laser 1 according to this invention. In addition to the module, there are also mounted, in the optical transmitter 75, a multiplexer circuit for multiplexing a plurality of electric signals at a low bit rate inputted to the optical transmitter 75 into high bit rate signals, a modulator driver for increasing the amplitude of output signals from the multiplexer circuit such that the module 74 can be driven and a laser driving circuit for driving the three modules, a temperature controller circuit, a multiplexer (MUX) driving circuit and a driver driving circuit. In the example shown in FIG. 12, the module 74 and the modulator integrated laser housed therein have to be manufactured considering that the difference between the temperature of the module 74 and that of the outer wall of the module 74 is large (for example, 75° C.). As shown in FIG. 1, as the difference between the temperature of the modulator integrated laser 1 and the temperature at the outer wall of the module 74 is larger, the consumption power of a Peltier cooler that controls the temperature of the modulator integrated laser increases abruptly. FIG. 1 is a graph showing an example of a relation between the difference of the case temperature to the chip temperature of a semiconductor laser chip, and the consumption power by the Peltier cooler.

Further, consumption power for other laser driving is relatively small as about 0.2 W. Accordingly, the consumption power for the entire module increases abruptly as the temperature difference increases.

However, when the temperature of the laser is made higher by using a multiple-quantum well structure constituted with InGaAsP for the laser active layer region, this results in the problem that (1) an optical power is lowered and (2) long-time stability for the oscillation wavelength can not be kept. Accordingly, the setting temperature for the module integrated laser has to be lower than 30° C. On the other hand, in the transmitter, for example, as shown in FIG. 12, the consumption power for the modulator driver, the multiplexer (MUX) and the power supplier therefor is large, and the average temperature in the module transmitter is usually about 40° C. or higher. Accordingly, if the setting temperature for the chip can be made higher than usual, it is possible to reduce the difference between the case temperature and the chip temperature of the optical transmission module and, the consumption power for the entire module can be decreased. Further, when it is intended to reduce the size of the optical transmitter (board) incorporated with the module or the optical transmission chip, the module as a heat generating source and other driving IC have to be disposed being close to each other. In this case, the chip environmental temperature will increase further.

In the existent modulator integrated semiconductor laser using InGaAsP for the laser active layer, the two problems described above hinder the rise of the setting temperature and decrease of the module consumption power.

Next, for making the oscillation wavelength of an optical modulator integrated laser variable, it is effective to control the wavelength by the temperature control for the laser region. In the document (2) above, temperature control is conducted not only for the laser region but also for the entire chip. This is a method of changing the temperature near the active layer of the laser thereby varying the oscillation wavelength of the distributed feedback type laser. However, since this results in a problem for the optical power level at high temperature and the long time stability of the oscillation wavelength as described above, it permits only the chip temperature of lower than 30° C. as the operation condition capable of obtaining the longest wavelength right. Therefore, the chip temperature has to be lowered in order to make the wavelength variable range wider. Therefore, there has been a problem that the difference between the temperature of the module and that of the outer wall is large to increase the module consumption power. Further, in the optical modulator, the light wavelength suitable to transmission of optical digital signals for a long distance changes depending on the temperature and the variation coefficient is, for example, at 0.8 nm/° C. On the other hand, the variation coefficient of the laser oscillation wavelength depending on the temperature is, for example, 0.1 nm/° C. For keeping the modulation performance constant, it is necessary to keep the difference between the band gap wavelength of the modulator region and the oscillation wavelength of the laser substantially constant. For example, if the band gap wavelengths of both of them are excessively closer, it results in a problem of lowering the optical power and degrading the extinction ratio. However, when the temperature of the laser and the modulator are elevated while keeping them identical, since the change of the laser oscillation wavelength is merely ⅛ for that of the band gap wavelength of the modulator, the laser oscillation wavelength approaches excessively to the optimal operation wavelength of the optical modulator.

In order to prevent this, the temperature for the modulator has to be controlled independently of the temperature for the laser region. In a case where most of the portions of the chip are controlled by a Peltier cooler (electronic temperature control element, electronic cooling (and heating) element) and the temperature near the laser active layer is controlled by a heater disposed on the chip, since the ratio of the temperature variation coefficient of the laser oscillation wavelength to the temperature variation coefficient of the band gap wavelength of the modulator region is 1:8, the amount of the wavelength variation for the laser region and the optimal amount for the wavelength variation of the modulator region can be made substantially identical, for example, by warming the laser region such that the temperature for the modulator rises by 1.25° C. when the temperature for the laser region rises by 10° C. For example, as shown in FIG. 13, this can be attained by properly designing the distance between the modulator and the laser when locating a heater 76 on the modulator integrated laser such that the heat conductivity from the heater 76 to the active laser 77 is 8 times as much as the heat conductivity from the heater 76 to the modulator region 78. There exists an upper limit for the temperature at which the laser 77 operates appropriately (for example, 30° C.). On the other hand, for making the wavelength variable, the laser region has to be heated locally by the heater while keeping the temperature for most of the portions of the chip lower than the upper limit for the laser operation. As the temperature is relatively lower than the upper limit for the case temperature to be considered, the temperature for the entire chip as a reference before heating by the heater has to be lowered corresponding to the required range for the wavelength variation. For example, for obtaining a wavelength variable range of 4 nm at the upper limit value for the laser operation temperature of 30° C., the chip temperature has to be at −10° C. In this case, the shortest oscillation wavelength can be obtained. When the temperature for the laser region is changed to 30° C. by heating with a heater while keeping the temperature for the entire chip at −10° C., an oscillation wavelength longer by 4 nm can be obtained. In this case, the temperature for the entire chip is lower as much as by 85° C. than the upper limit of 75° C. for the case temperature. This difference increases as the upper limit for the laser operation temperature lowers to increase the module consumption power. As described above, in the laser constituted with an InGaAsP MQW, while the lowest chip setting temperature has to be lowered since the lowering of the output power at high temperature results in the problem. However, the consumption power increases as the case temperature of the optical transmission module is higher. The lowest temperature is often lower than the room temperature and the problem is more serious compared with the case of usual optical transmission module with no wavelength variable function.

The module for optical communication of this invention basically comprises at least an active region of a semiconductor laser, a modulator region for modulating the light from the active region of the semiconductor laser, a temperature control component for temperature control at least of the modulation region, in which the active layer of the semiconductor laser has a multiple-quantum well structure having at least two quaternary mixed crystal layers selected from the group consisting of quaternary compounds of In, Ga, Al and As and quaternary compounds of In, Ga, N and As, in which the temperature of at least the modulator region during operation can be set to 30° C. or higher. When the module has the modulator which is integrated with the semiconductor laser chip, temperature setting therefor is often adapted such that the temperature for the active region of the semiconductor laser chip and the component, in the module, thermally in contact with the semiconductor laser chip for holding the active region of the semiconductor laser chip can be set to 30° C. or higher. The active region of the semiconductor laser chip, specifically the active layer region thereof is an important region for the temperature control.

In this invention, it is important that the active region of the semiconductor laser is constituted with a multiple-quantum well structure comprising a quaternary mixed crystal layer selected from the group consisting of quaternary compounds of In, Ga, Al and As or quaternary mixed compounds of In, Ga, N and As. By the use of the quaternary compound semiconductor material containing Al, it is possible to ensure the optical power characteristic in a high temperature atmosphere. Alternatively, an N-containing compound semiconductor material may also provide a similar effect.

By using the quaternary compound semiconductor material of In, Ga, Al and As, it is possible to make the band offset value of the conduction band larger than the valence band offset value. Accordingly, overflow of injection current at high temperature is reduced. As described above, in this invention, decrease of the optical power at high temperature can be suppressed. As described above in this invention, it is extremely important to make the band offset value of the conduction band larger than the band offset value of the valence band.

Accordingly, when other compound semiconductor material is used as the semiconductor compound material constituting the quantum well structure, it is possible to extremely moderate the requirement of cooling the optical modulator in order to obtain a predetermined optical power. That is, the temperature for the modulator region can be set at a temperature higher than 30° C.

Further, in this invention, the temperature control component usually used for the semiconductor chip region, for example, a thermoelectric cooler may be no more necessary. Of course, the feature of this invention can be attained also by using the usual temperature control component as described above. Also in this case, since the temperature can be set at a higher temperature than usual, for example, 31° C. or 34° C., the consumption power can be decreased effectively. In this specification, "not using cooling component" means not using such positive cooling component, cooling component with power consumption, specifically, an element resulting in power consumption, for example, a Peltier cooler. Accordingly, it does not mean to exclude the use, for example, of an air cooling component obtained by the structural consideration.

Furthermore, the temperature during operation of this optical module can be set at 35° C. or higher. In this case, the consumption power can be reduced further. Also in this case, the feature of this invention can of course be practiced by using the usual temperature control component as those described above. Also in this case, since the temperature can be set higher than usual, the consumption power can be decrease extremely.

Heretofore, it has not even been thought that the operation at such high temperature is possible in a semiconductor laser device, among all, in a semiconductor light emitting device having on an optical modulator. This is attained for the first time in accordance with this invention.

Constitution for the quantum well structure by using the InGaAlAs series compound semiconductor or InGaNAs series compound semiconductor may be in accordance with a usual method.

The inventive idea of this invention is useful for a multi-active region semiconductor laser device, a semiconductor laser device having a plurality of oscillation wavelengths, and a semiconductor light emitting device having a semiconductor laser region and an optical modulation region. For example, an active region corresponding to a predetermined wavelength of DWDM (Dense Wavelength-Division Multiplexing) can be constituted as a plurality of chips, that is, as a multi-chip. Further, when the semiconductor laser region has a plurality of oscillation wavelengths, this invention is extremely useful.

Among all, this invention is useful for the semiconductor laser device in which a modulator is integrated. In this case, a semiconductor light emitting device having a plurality of active regions and synthesizing the lights therefrom in a multiplexer and modulating the light by an optical modulator is a typical embodiment.

This invention can also take an embodiment in which respective regions constituting a semiconductor light emitting device such as the semiconductor laser chip region and the modulator region or the multiplexer may be constituted as individual separate semiconductor chip regions, or as an embodiment in which such regions are constituted as a semiconductor chip integrated on one identical substrate.

As the modulator, a usual electroabsorption type optical modulator is useful.

In one of most typical examples of this invention, a temperature control component, for example, a heater is disposed near the active layer region of the semiconductor laser region, to enable control for the oscillation wavelength. Furthermore, in such an example, a temperature control component, for example, a heater is often disposed near the optical modulation absorption layer of the modulator.

DESCRIPTION OF THE PREFERRED EMBODIMENTS

Prior to explanation for a concrete example of this invention, technical details according to the invention are to be explained. Further, comparison with the prior art is also shown.

In a typical example of this invention, an MQW having a laser active layer constituted by using InGaAlAs with a band offset for a conduction band being 100 meV or more is adopted in order to maintain an optical power and decrease the consumption power of a module in a state of ensuring oscillation wavelength stability at high temperature. This invention is more effective by using such a band offset.

Figure 1:
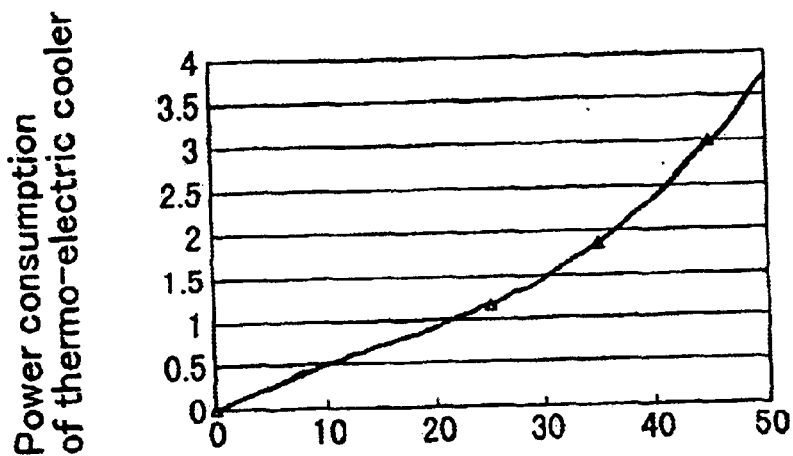
FIG. 1 is a graph illustrating a relation between the difference of the chip temperature relative to the module case temperature, and the consumption power.
Figure 2:
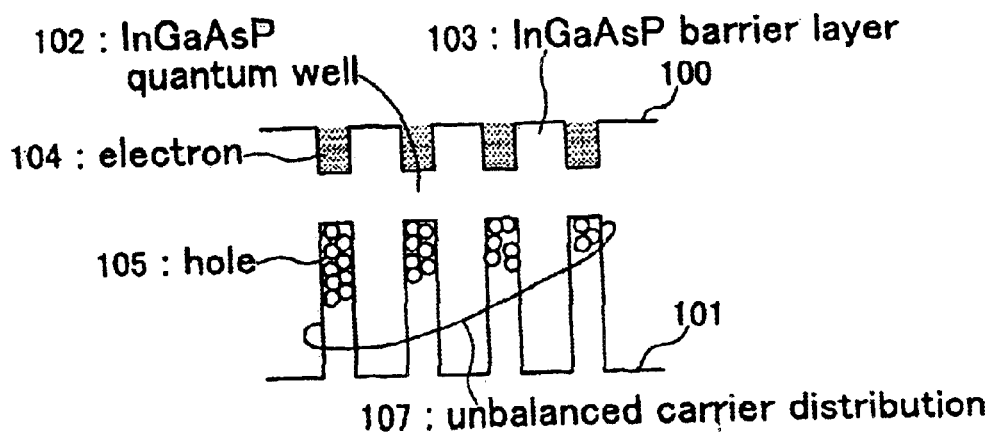
FIG. 2 shows a band diagram for an InGaAsP multiple-quantum well.

FIG. 2 schematically shows a band structure of an InGaAsP MQW. This embodiment of MQW comprises an InGaAsP well layer 102 and an InGaAsP barrier layer 103. Reference 100 denotes the lower end for a conduction band and 101 denotes an upper end for a valance band. Electron 104 and hole 105 are shown. Holes 107 are injected not uniformly in each of the well layers. As shown in FIG. 2, in the InGaAsP MQW, the band offset of the conduction band is usually about equal with or less than the band offset of the valence electron band.

Figure 3:
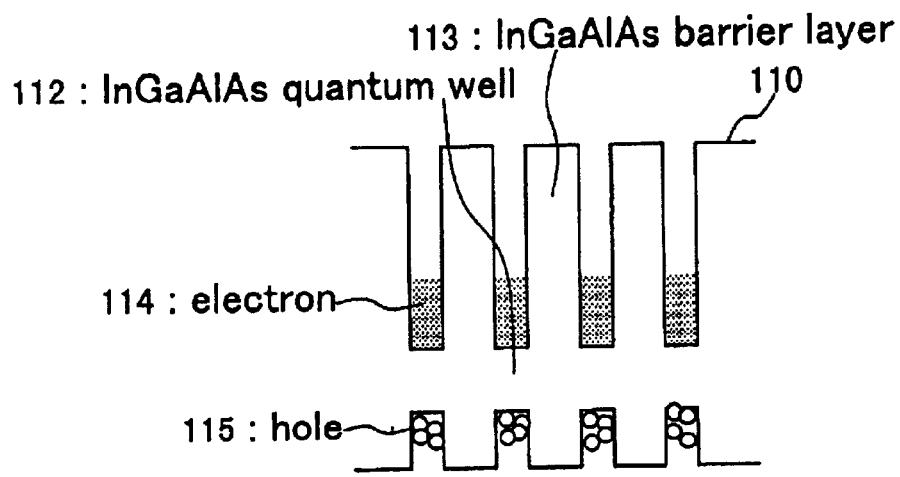
FIG. 3 shows a band diagram for an InGaAlAs multiple-quantum well.

However, as shown in FIG. 3 in the appropriately strained InGaAlAs-MQW, the band offset of the conduction band is larger than the band offset of the valence electron band. FIG. 3 schematically shows the band structure of an InGaAlAs-MQW laser. This embodiment of the MQW laser comprises an InGaAlAs well layer 112 and an InGaAlAs barrier layer 113. There are shown a lower end 110 for the conduction band, an upper end 111 for the valance band, electrons 114 and holes 115.

With such a constitution, overflow of an injection current at high temperature can be reduced to suppress the decrease of the optical power at high temperature. Since the overflow of carrier is remarkable at high temperature when the InGaAsP-MQW laser shown in FIG. 2 is operated under control for keeping the optical power constant, the injection current has to be increased by so much as the overflow of the carrier in order to compensate the decrease of the optical power caused by the degradation of crystals. That is, when the band offset of the conduction band is small, the slope efficiency is lowered when the current injection level is higher to result in excess increase of the current injection. Accordingly, in the existent modulator integrated laser using InGaAsP-MQW laser of small conduction band offset, the oscillation wave length increases more compared with the modulator integrated laser using an InGaAlAs-MQW laser and long time stability of the oscillation wavelength can not be kept at a high temperature operation.

Figure 4:
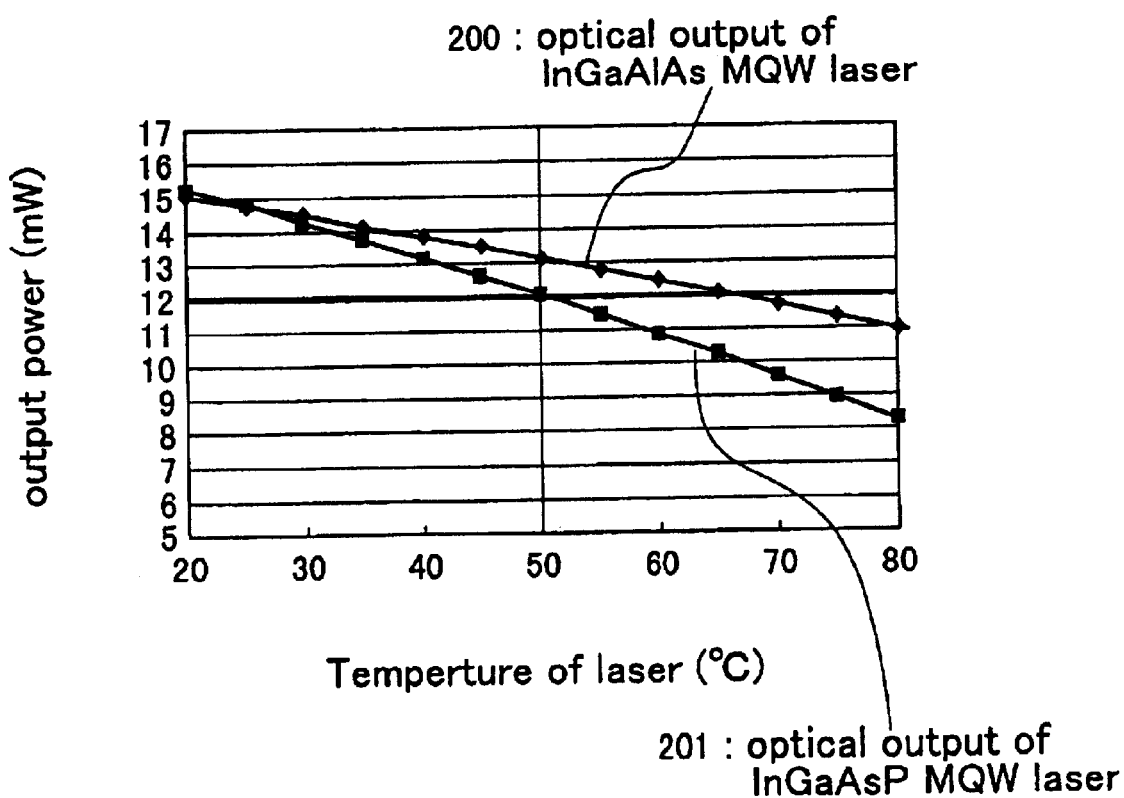
FIG. 4 is a graph illustrating a relation between the optical power and the temperature of the laser active layer region.
Figure 5:
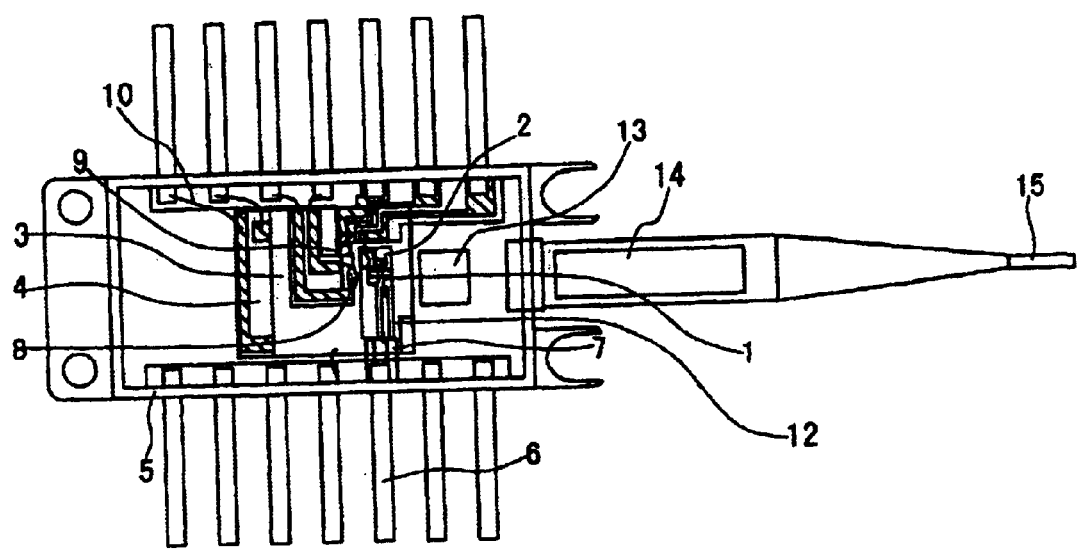
FIG. 5 is an top plan view of a module.
Figure 6:
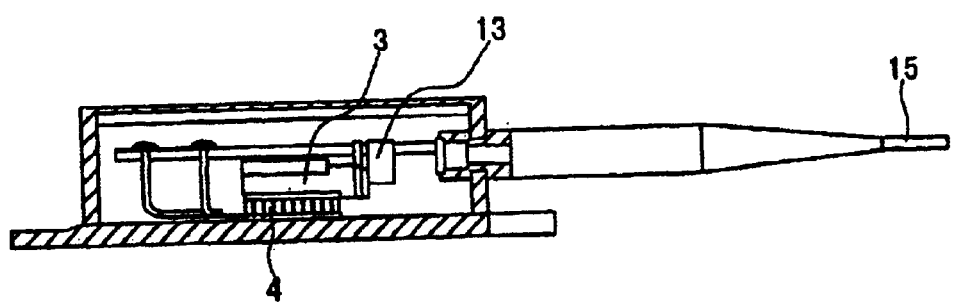
FIG. 6 is a cross sectional view of the module.

FIG. 4 illustrates a graph showing a relation between a laser chip temperature and an optical power. A curve 200 shows a semiconductor laser chip using an InGaAlAs-MQW and a curve 201 shows a semiconductor laser chip using an InGaAsP-MQW. Actually, as shown in FIG. 4, the output power less decreases in this invention even when the temperature of the laser active layer is high. Thus, the chip temperature and the environment temperature of the chip can be elevated to a higher temperature during operation of the module. "During operation of module" means a state where optical signals are transmitted from the laser and a sufficient eye opening is obtained after fiber transmission over a desired distance. Accordingly, this state means that the laser, the modulator, the temperature control system and the wavelength adjusting system are operated as designed under electric power supply. Further, "environmental temperature of the chip" indicates a temperature of a portion between a temperature control element such as a Peltier cooler for temperature control of the chip for physically holding the chip and the chip. Actually, the temperature indicated by a thermister in contact with a carrier for holding the chip is defined as a chip temperature as shown in FIG. 5 and FIG. 6. Actually, the temperature of an optical transmission device on which an optical transmission module is disposed often rises to 40–50° C. or higher. Details for FIG. 5 and FIG. 6 will be described later.

When the material is used as a laser active layer, the temperature of the modulator integrated chip has to be kept near an average value of a case temperature for a optical transmission module in order to minimize the average consumption power of the optical transmission module.

In a laser module for conducting DWDM (Dense Wavelength Division Multiplexing) transmission, when one laser module can cope with multi-channel wavelengths, the number of the back-up light sources to be provided for failure can be saved. Accordingly, this embodiment can restrict the cost of the transmission device and change the transmission destination by the laser wavelength, which is effective for the efficient operation of a network. Further, compared with a system of using DBR (Distributed Bragg Reflector), the wavelength variable laser of a system adjusting the oscillation wavelength depending on the temperature change of the laser active layer is suitable to optical transmission in a long distance trunk system since the stability of the longitudinal mode is high and the spectral line width is fine upon wavelength variation.

Further, for elevating the chip setting temperature in the modulator integrated laser, transmission performance and optical waveform out of the modulator can not be obtained unless the difference between band gap wavelength of the active layer of the laser and the absorption layer of the modulator is changed in a special relation. Actually, in the modulator integrated laser, for setting the output waveform of the modulator to a determined standard, the peak wavelength of the electro-luminescence from the active layer (before laser oscillation) at the operation temperature of the InGaAs/InGaAlAs quantum well in the laser region is about 1.55 $\mu$m and it is set to a wavelength shorter by about 5 nm than the oscillated wavelength specified by ITU. The emission wavelength at the operation temperature of the modulator region is shorter by 40 nm or more and it has to be set to 1510 nm or less. However, since the composition for the constituent elements of the MQW at room temperature is usually measured at a room temperature, the oscillation wavelength of the laser region at the room temperature has to be further shortened by: $\Delta\lambda=\Delta T\times$(temperature variation coefficient of laser oscillation wavelength (nm/°C.)—band gap wavelength of modulator absorption layer) than the band gap wavelength of the modulator region assuming the deviation between the room temperature and the operation temperature as $\Delta T$ upon manufacture of the chip for compensating the difference between the temperature characteristic of the laser region and the temperature characteristic of the modulator region. The modulator absorption layer is constituted with a quantum well layer. Actually, for setting the chip temperature to 50° C., 40 nm difference between the laser oscillation wavelength and the modulator band gap wavelength has to be shortened by 57.5 nm for the modulator band gap in view of the transmission performance and waveform quality in a case of an appropriate modulator.

Embodiment 1

FIG. 5 is an upper plan view for the inside of a semiconductor laser module according to this invention and FIG. 6 is a transversal cross sectional view for the inside of the module.

An optical modulator integrated semiconductor laser diode 1 is mounted, for example, on an AlN sub-mount 2 and the sub-mount 2 is fixed by soldering to a carrier 3. The carrier 3 is mounted on a Peltier cooler 4 and contained in a metal containment case 5. The laser carrier corresponds to a component for holding an active region of a semiconductor laser chip in general description. A thermister 9 as a temperature sensor is in contact with the carrier 3 to monitor the temperature of the carrier. The thickness of the AlN sub-mount is 0.254 mm, the heat conductivity is 1.3 W/cmK and the temperature difference between the carrier and the chip can be made 1° C. or lower. Accordingly, it may be regarded that the temperature shown by the thermister is substantially identical with the chip temperature.

In FIG. 5, reference 6 denotes a lead frame which is an input terminal for electric signals and reference 7 denotes a microstrip line for inputting module signals.

Figure 7:
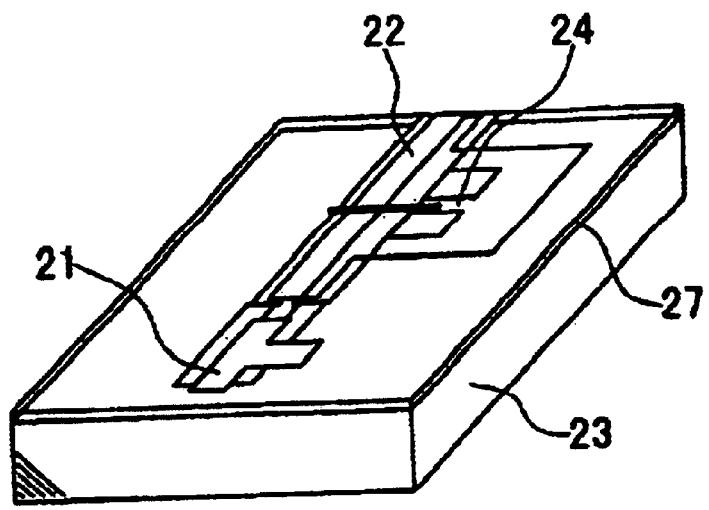
FIG. 7 is a perspective view of a laser chip in which a modulator is integrated.

FIG. 7 is a perspective view for the structure of a modulator integrated laser chip.

Reference 21 denotes a p-type electrode for application of electric field to the modulator and an optical waveguide constituting an optical modulator is disposed just below the electrode. Reference 22 denotes a current injecting p-type electrode for a DFB (Distributed Feedback) laser and an optical waveguide constituting the laser is disposed just therebelow in the same manner as the modulator. Reference 27 denotes a grating of the DFB laser for the single mode stability of the longitudinal mode of the laser (mode in the direction parallel with the optical waveguide). Then, a grounding electrode is disposed also at the back of the sub-mount, which is fixed to a CuW carrier and grounded to the earth. The CuW carrier is denoted by reference 3 in FIG. 5.

Reference 8 in FIG. 5 denotes a photodiode that monitors the intensity of light radiated from the side opposite to the modulator 1 of the laser chip, thereby enabling constant power keeping control of outputting constant optical power from the laser region. There are also shown a fiber coupling aspheric lens 13, an isolator 14 and a single mode fiber 15.

Figure 8:
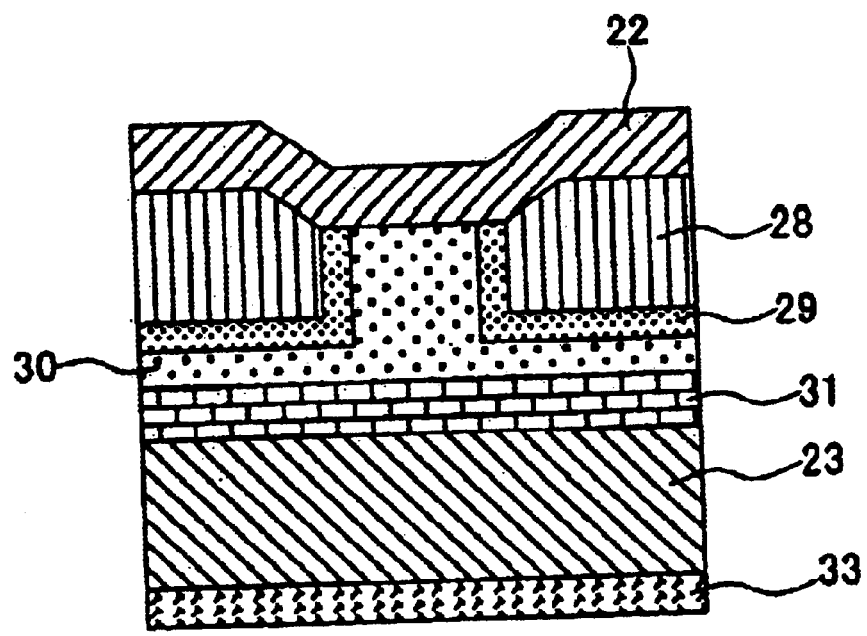
FIG. 8 is a cross sectional view of a laser chip in which the modifier is integrated at a plane intersecting the progressing direction of light.

FIG. 8 is a cross sectional view of a chip taken along line 24 in FIG. 7. Accordingly, FIG. 8 is a cross sectional view along a plane perpendicular to the progressing direction of a laser beam. On an n-type InP substrate 23, are formed an active layer region 31 having a multiple-quantum well structure constituted with InGaAlAs/InGaAlAs, and an upper guiding layer 30 by vapor phase deposition. The thickness of the upper guiding layer 30 is, for example, 1.7 μm. An InGaAs contact layer of 0.2 μm thickness is formed further thereon. The contact layer is not illustrated in the drawing.

A stripe of 1.7 μm width is formed at a depth of 1.9 μm to the thus formed semiconductor layer 30, to constitute a waveguide. A protection film 29 for protecting the waveguide is formed, for example, with $SiO_2$. For forming the p-type electrode 22, other portions than the waveguide stripe are flattened with a polyimide resin 28. Then, the p-type electrode 22 is formed. Finally, an n-type electrode 33 is formed at the rear face of the semiconductor substrate.

The carrier having the high frequency circuit as described above is mounted on the Peltier cooler 4. The Peltier cooler is denoted by reference 4 in FIG. 5. The Peltier cooler 4 is fixed at the bottom of the containment case 5. When a predetermined current is supplied by way of leads 10 of the Peltier cooler 4, heat absorption occurs on the upper side of the Peltier cooler 4 to cool the sub-mount 2 and the semiconductor laser chip 1 on the carrier 3. Further, by reversing the polarity of the current supplied, heat can be added to the chip to elevate the chip temperature. Reference 9 in FIG. 5 denotes a thermister that monitors the temperature by the resistance and keeps the driving temperature of the laser constant at a set temperature.

Figure 9:
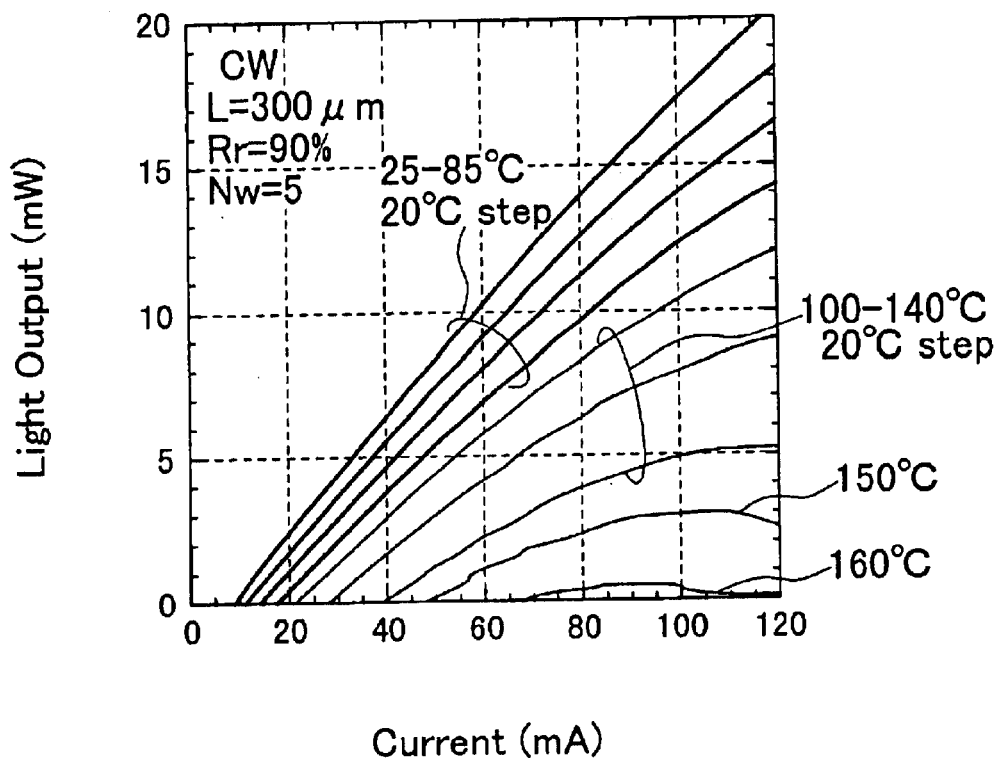
FIG. 9 is a graph illustrating a relation between the current/optical power for a laser chip in which the modulator is integrated in accordance with this invention.

In the chip structure shown in FIG. 7, the band gap wavelength for the laser region and the modulator region is changed by a well-known method, that is, a selective growing technique. The band gap wavelength of the laser region in the quantum well layer 31 at a room temperature was set to 1550 nm. On the other hand, the photoluminescence wavelength in the modulator region of the identical quantum well structure was set to 1480 nm. Then, the oscillation wavelength at 50° C. was 1552.5 nm and the band gap wavelength of the modulator region was 1505 nm. Further, the thickness of the quantum well was 7 nm at the modulator region and the film thickness of the barrier layer was 5 nm. The compositional ratio was $In_{0.7}Al_{0.049}Ga_{0.251}As$ and $In_{0.352}Al_{0.1}Ga_{0.54}As$ for the quantum well region and the barrier layer region, respectively. The number of the quantum well layers is 8. Accordingly, the threshold current is 13 mA and an optical power of 16 mW at the injection current of 100 mA was obtained in a case where the chip temperature was set to 45° C. FIG. 9 shows examples of the characteristic in this embodiment. The abscissa denotes a injection current and the ordinate denotes an optical power. Regarding the characteristic shown in the figure, the curve expressed as "25–85° C., 20° C. step" or "100–40° C., 20° C. step" means the followings. That is, the former bundle of the curves shows the characteristic curves at 25° C., 45° C., 65° C. and 85° C. from the upper curve at 20° C. step starting from 25° C. The latter bundle of the curves may be explained in the same manner.

As shown by this embodiment, according to this invention, the consumption power can be reduced from existent 4.9 W to 1.7 W. Further, when GaAs is used as an n-type substrate and the InGaNAs/InGaNAs multiple-quantum well structure is used as the quantum well layer for the layer 31 in FIG. 8, a similar effect for decreasing the consumption power of the module can be obtained.

Embodiment 2

This embodiment is an example in which a laser region having a plurality of active regions, a modulation chip region and a multiplexer are integrated on one substrate.

Figure 10:
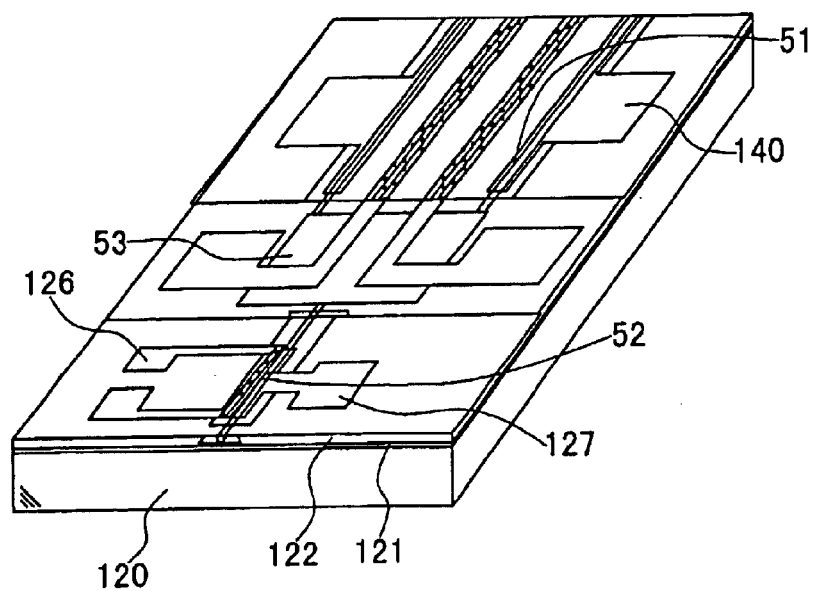
FIG. 10 is a perspective view of a chip in which a multi-active region laser chip is integrated.

FIG. 10 shows an example in which a plurality of distributed feedback laser chip regions 51 and a modulation chip region 52 are connected by multiplexers 53 on one identical substrate 120. The basic constitution for other portions than the portion relevant to the invention may be constituted with a conventional structure. There are shown electrodes 140 for the laser regions, an electrode 127 for the modulator region, a component 126 for temperature control, specifically, a heater.

In this embodiment, four laser oscillation regions are provided and the oscillation wavelength for each of them is arranged at 3.2 nm distance. Control at a higher accuracy for the oscillation wavelength is conducted by controlling the temperature of the laser active layer region. Accordingly, like the case of using a single laser, the chip setting temperature can be elevated by using the InGaAlAs/InGaAlAs multiple-quantum well structure for the active layer in order to decrease the consumption power of the module.

Figure 11A:
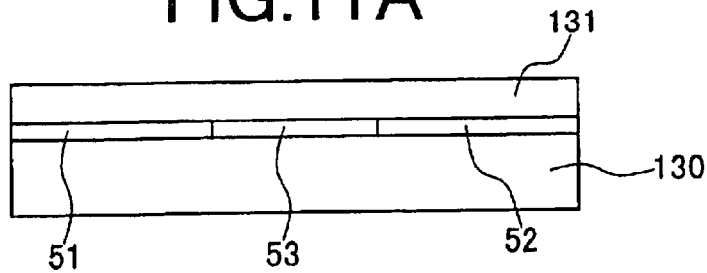
FIG. 11A is a cross sectional view of a chip in which a multi-active region laser chip is integrated.

FIG. 11(a) shows a cross sectional view of a chip. A DFB laser region 51, a multiplexer region 52 and a modulator region 53 are mounted on one substrate 130. Reference 131 denotes a semiconductor layer on the side opposite to the substrate. The multiple-quantum well structure and the band gap wavelength of the laser region 51 and the modulator 53 are identical with those in Embodiment 1. However, the core of the optical waveguide region of the multiplexer 52 is constituted with InGaAsP and the band gap wavelength at the room temperature was set to 1.2 μm. The clad layer of the multiplexer, that is, upper and lower layers for the core are constituted with InP. In this embodiment, a chip having a wavelength variable range of 15 nm and a power consumption of 1.5 W can be attained.

Embodiment 3

This embodiment is an example of applying the invention to a semiconductor laser chip having a positive wavelength variable component. Different from the two embodiments described above, this is an example for decreasing the consumption power of the wavelength variable laser module adapted to keep the temperature of the modulator region to a chip setting temperature by using a heater for the laser region and locally heating the laser region.

Figure 11B:
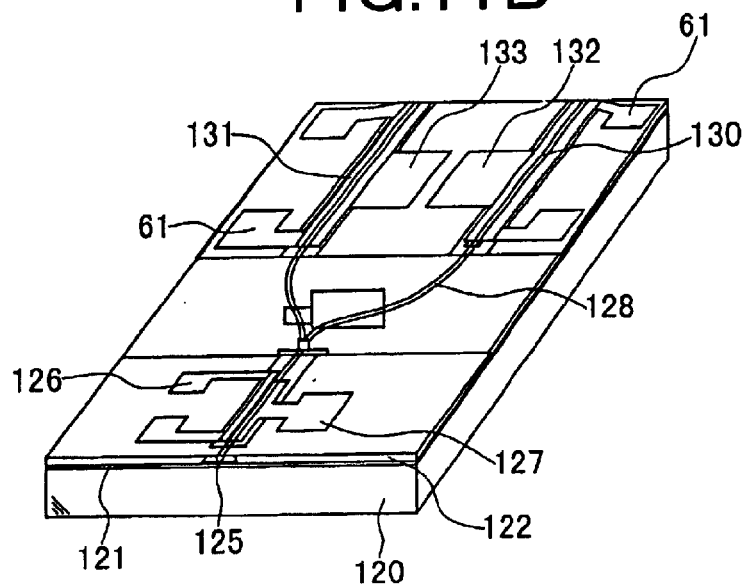
FIG. 11B is a perspective view of a wavelength variable laser having a heater mounted near a modulator.

FIG. 11(b) is a perspective view showing this embodiment. A polyimide layer 122 is formed for flattening and reduction of an electrode capacitance on a predetermined semiconductor substrate 120 by way of a semiconductor layer region 121 for forming a semiconductor chip region. References 130 and 131 denote laser chip regions respectively and references 132, 133 denote electrodes of the laser regions respectively. In this embodiment, temperature variable components, for example, heater regions 61 are disposed adjacent the laser regions 130, 131. The laser beam from the laser regions 130 and 131 can be inputted by way of optical waveguides 128 to a modulator region 125. In adjacent with the modulator region 125, a temperature variable component, for example, a heater 126 is disposed. Reference 127 denotes an electrode on one side.

By controlling the temperature of the laser region with the heater 61 shown in FIG. 11(b), the oscillation wavelength is changed and the temperature of the active layer region (absorption layer) of the modulator can be made constant to keep the shape of the optical power waveform and the long distance transmission performance under optimal conditions. Also in this case, the module consumption power can be decreased by setting the chip setting temperature, that is, the modulator active layer (absorption layer) temperature higher. Actually, like the example, a wavelength variable integrated laser of high reliability and high power even at a high temperature can be realized by constituting the active layer region having the quantum well structure of the DFB laser region and the quantum well absorption layer of the modulator of the multiple-quantum well structure constituted with InGaAlAs/InGaAlAs, or a multiple-quantum well structure constituted with InGaNAs/InGaNAs. In this case, the wavelength difference between the laser oscillation wavelength of the laser region and the band gap wavelength of the modulator region is of course made larger at room temperature like that in Example 1.

Figure 11C:
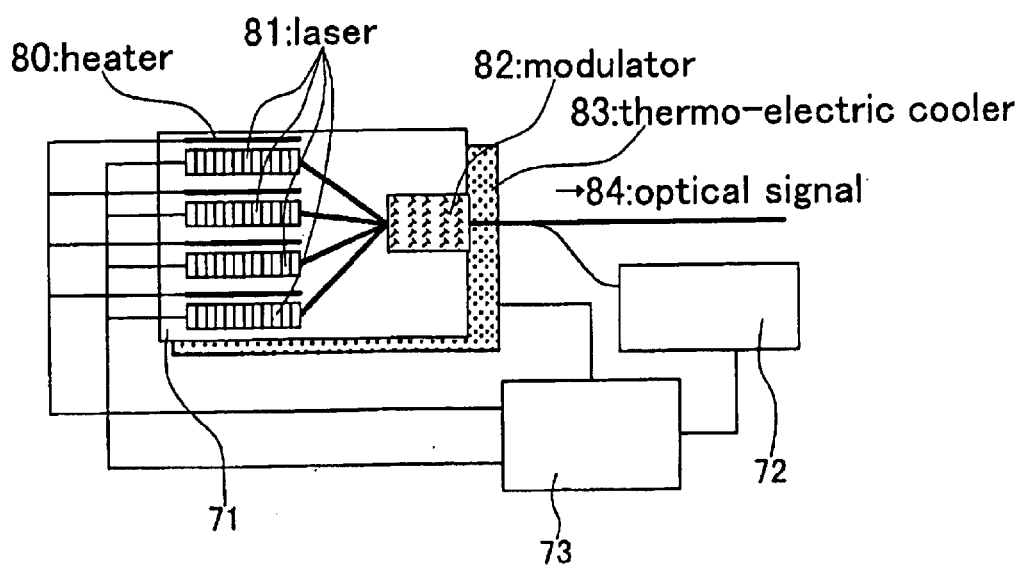
FIG. 11C is a loop chart illustrating an example of a mechanism for wavelength control.
Figure 12:
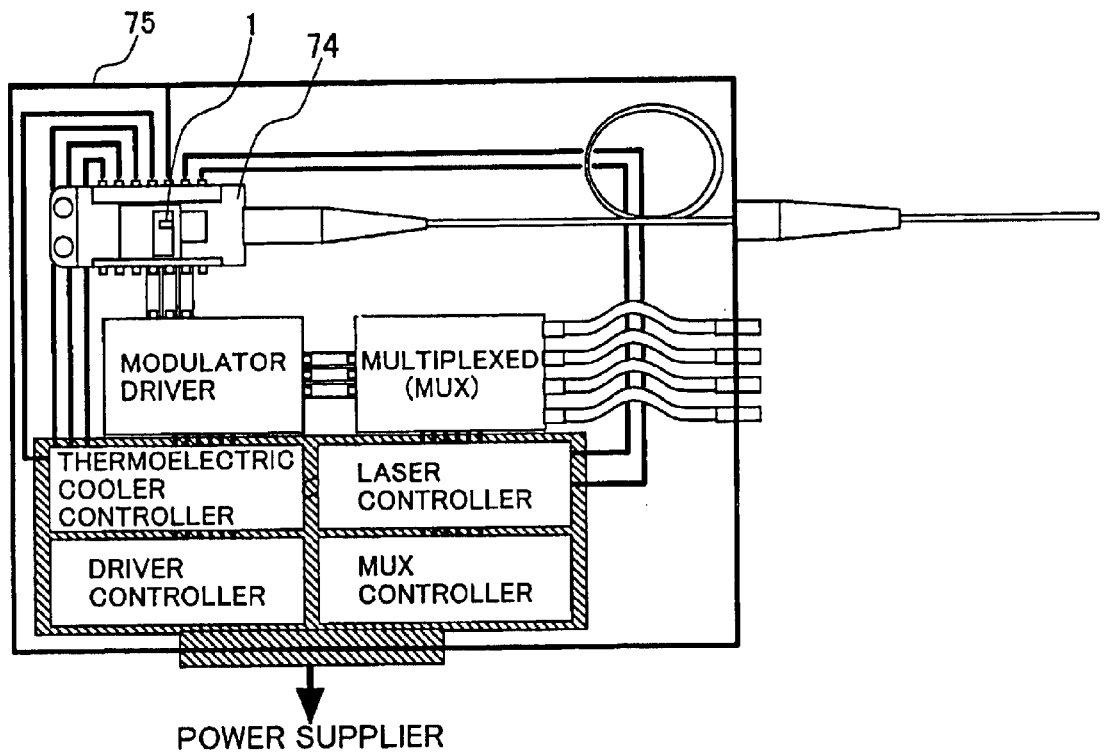
FIG. 12 is a plane view of an example of an optical transmission module including a modulator integrated laser.
Figure 13:
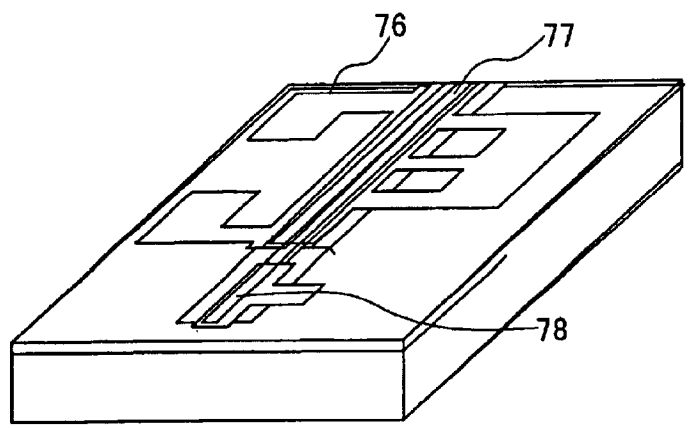
FIG. 13 is a perspective view of a wavelength variable laser having a heater mounted near a modulator.

In this embodiment, a feedback system as shown in FIG. 11(c) is introduced for controlling the wavelength at a high accuracy. FIG. 11(c) is a view illustrating the basic constitution. A laser region 81 and a modulator region 82 are mounted on a Peltier cooler 83. The laser region 81 is disposed in plurality and a temperature variable component, for example, a heater 80 is disposed in the vicinity of each of the laser regions 81 to constitute a wavelength variable laser 71.

In this embodiment, optical signals 84 are emitted from the modulator 82, and a wavelength monitor 72 for monitoring the wavelength of the light is disposed. This wavelength monitor 72 is a wavelength monitor for converting the change of the wavelength into the change of the voltage. Based on the signals from the wavelength monitor 72, the laser region 81, the heater region 80 and the Peltier cooler 83 are controlled. The wavelength monitor can be constituted, by the combination of a filter such as etalon having a wavelength dependency and a photo-receiving chip. That is, a signal light 84 is partially branched and introduced into the wavelength monitor 72. The light transmits the etalon filter having the transmissivity being different depending on the wavelength and then enters the photo-receiving chip. This can provide a correspondency between the light intensity and the wavelength of light incident to the photo-receiving chip and the wavelength can be monitored by the received light intensity.

Actually, it is designed such that the output from the wavelength monitor is reduced to zero when a light at desired wavelength is outputted from the laser. Actually, a table capable of classifying the required light wavelength into four is stored in the memory in a control system 73 and current is supplied to a predetermined laser to oscillator the same. Then, a current is supplied to a heater disposed near the laser during operation for conducting the fine adjustment of the wavelength and the power of the heater is increased continuously till the output of the wavelength monitor is reduced to zero. In this case, the current for the Peltier cooler is increased such that the output of the thermister 9 in FIG. 5 is identical with the chip temperature setting value in order to keep the temperature of other regions than the laser region of the chip constant. The two controls can be conducted by using a single digital IC or can be controlled in combination of analog circuits.

Further, while the heater is disposed near the laser in this embodiment, a wavelength variable laser can be attained also by disposing the heater near the modulator, keeping the temperature of the modulator by the heater and the Peltier cooler and keeping the temperature of the laser region by the Peltier cooler.

Typical examples for various embodiments according to this invention explained so far are set force as below.

At first, an optical communication module containing a modulator integrated laser in which an active layer of the modulator integrated semiconductor laser for optical communication is constituted with a multiple-quantum well containing quaternary mixed compounds of In, Ga, Al and As, and the temperature of the semiconductor laser chip or the component in thermally contact with the chip for holding the laser is at 35° C. or higher during operation of the laser and the modulator.

Secondly, an optical communication module containing a modulator integrated laser in which an active layer of the modulator integrated semiconductor laser for optical communication is constituted with a multiple-quantum well containing quaternary mixed compounds of In, Ga, N and As, and the temperature of the semiconductor laser chip or the component in thermally contact with the chip for holding the laser is at 35° C. or higher during operation of the laser and the modulator.

Thirdly, an optical communication module in which the active layer of the optical communication modulator integrated semiconductor laser is constituted with multiple-quantum well containing quaternary mixed compounds of In, Ga, Al and As or quaternary mixed compounds of In, Ga, N and As, a heater is formed near the laser active layer, near the optical modulator absorption layer or near both of them for applying the heat to the active layer and the absorption layer, and the highest temperature of the active layer is 35° C. or higher during operation of the module.

Fourthly, an optical communication module in which the active layer of the optical communication modulator integrated semiconductor laser is constituted with a multiple-quantum well containing quaternary mixed compounds of In, Ga, Al and As or quaternary mixed compounds of In, Ga, N and As, a plurality of modulator integrated chips and multiplexers for outputted optical signals are contained within the module and the highest temperature of the active layer is 35° C. or higher during operation of the module.

Fifthly, an optical communication module in which the active layer of the optical communication modulator integrated semiconductor laser is constituted with a multiple-quantum well containing quaternary mixed compounds of In, Ga, Al and As or quaternary mixed compounds of In, Ga, N and As, a plurality of optical waveguides for constituting the laser, a multiplexer for multiplexing laser outputted light and an optical modulator are contained on one identical substrate, and the highest temperature of the active layer is 35° C. or higher during operation of the module.

As has been described above specifically according to this invention, the consumption power of the module, particularly, the consumption power of the Peltier cooler of the modulator integrated laser module can be decreased. Further, in the wavelength variable modulator integrated laser module, broad wavelength variable range and reduction of the module consumption power can be attained simultaneously.

According to embodiments of this invention, it is possible to provide an optical module of a decreased consumption power while ensuring the stability of the oscillation wavelength also during operation at high temperature.

What is claimed is:

1. A module for optical communication having a modulator integrated laser includes a semiconductor laser active region and an optical modulation region for modulating the light from the semiconductor laser active region; and a temperature control region for controlling temperature of at least the optical modulation region, said semiconductor laser active region having a multiple-quantum well structure having at least two quaternary mixed compound crystal layers in which a band offset of a conduction band is larger than a band offset of a valence electron band, said at least two quaternary mixed compound crystal layers being selected from the group consisting of quaternary mixed compounds of In, Ga, Al and As and of quaternary mixed compounds of In, Ga, N and As, wherein a temperature of a semiconductor laser active region or a temperature of a component in thermal contact with the semiconductor laser active region for holding the temperature of the semiconductor laser active region is set to 35° C. or higher during operation of the semiconductor laser active region and the optical modulation region.

2. A module for optical communication as defined in claim 1, wherein the temperature control component is a heating component or a heater.

3. A module for optical communication as defined in claim 1, wherein the temperature control component is disposed without having a cooling component.

4. A module for optical communication having a modulator integrated laser includes a semiconductor laser active region having at least two active regions and an optical modulation region for modulating the light from the semiconductor laser active regions; a temperature control component for temperature control of at least the optical modulation region, and a control component for controlling the wavelength of the light emitted from the semiconductor laser active region, said semiconductor laser active region having a multiple-quantum well structure having at least two quaternary mixed compound crystal layers in which a band offset of a conduction band is larger than a band offset of a valence electron band, said at least two quaternary mixed compound crystal layers being selected from the group consisting of quaternary mixed compounds of In, Ga, Al and As and quaternary mixed compounds of In, Ga, N and As, wherein a temperature of at least the semiconductor laser active region or a temperature of the component in thermal contact with the semiconductor laser active region for holding the temperature of the semiconductor laser active region is set to 35° C. or higher during operation of the semiconductor laser active region and the optical modulation region.

5. A module for optical communication as defined in claim 4, wherein the temperature control component is a heating component or a heater.

6. A module for optical communication as defined in claim 4, wherein the temperature control component is disposed without having a cooling component.

7. A module for optical communication as defined in claim 4, wherein the semiconductor laser active region and the optical modulation region are constituted, respectively, with semiconductor chip regions separated from each other.

8. A module for optical communication as defined in claim 4, wherein the semiconductor laser active region and the optical modulation region are constituted as semiconductor chip regions integrated on the same substrate.

9. An optical transmission module having a modulator integrated laser includes a semiconductor laser active region and a plurality of optical modulation regions for modulating the light from the semiconductor laser active region, a multiplexer for multiplexing the outputted light and a temperature control component for temperature control of at least the optical modulation region, said semiconductor laser active region having a multiple-quantum well structure having at least two quaternary mixed compound crystal layers in which a band offset of a conduction band is larger than a band offset of a valence electron band, said at least two quaternary mixed compound crystal layers being selected from the group consisting of quaternary mixed compounds of In, Ga, Al and As and quaternary mixed compounds of In, Ga, N and As, and the temperature of at least the semiconductor laser active region or the temperature of the component in thermal contact with the semiconductor laser active region for holding the temperature of the semiconductor laser active region is set to 35° C. or higher during operation of the semiconductor laser active region and the optical modulation region.

10. A module for optical communication as defined in claim 9, wherein the temperature control component is a cooling component or a heater.

11. A module for optical communication as defined in claim 9, wherein the temperature control component is disposed without having a cooling component.

12. A module for optical communication as defined in claim 1, wherein said multiple quantum well structure comprises a well layer and a barrier layer, both layers of which consist of the same materials InGaAlAs materials of the same InGaNAs materials and wherein both layers of the same InGaAlAs materials or the same InGaNAs materials each have a different ratio of the same materials.

13. A module for optical communications as defined in claim 1, wherein said semiconductor laser active region and said optical modulation region are formed on the same substrate and are made of the same combination of materials with each said region having a different ratio of the same materials.

14. A module for optical communication as defined in claim 4, wherein said multiple quantum well structure comprises a well layer and a barrier layer, both layers of which consist of the same materials InGaAlAs materials of the same InGaNAs materials and wherein both layers of the same InGaAlAs materials or the same InGaNAs materials each have a different ratio of the same materials.

15. A module for optical communication as defined in claim 9, wherein said multiple quantum well structure comprises a well layer and a barrier layer, both layers of which consist of the same materials InGaAlAs materials of the same InGaNAs materials and wherein both layers of the same InGaAlAs materials or the same InGaNAs materials each have a different ratio of the same materials.

* * * * *